US008691605B2

(12) United States Patent
Moffatt

(10) Patent No.: US 8,691,605 B2
(45) Date of Patent: Apr. 8, 2014

(54) CRYSTALLIZATION PROCESSING FOR SEMICONDUCTOR APPLICATIONS

(71) Applicant: Applied Materials, Inc., Santa Clara, CA (US)

(72) Inventor: Stephen Moffatt, St. Brelade (JE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/679,633

(22) Filed: Nov. 16, 2012

(65) Prior Publication Data

US 2013/0143417 A1    Jun. 6, 2013

Related U.S. Application Data

(63) Continuation of application No. 12/953,103, filed on Nov. 23, 2010, now Pat. No. 8,313,965.

(60) Provisional application No. 61/265,312, filed on Nov. 30, 2009.

(51) Int. Cl.
*H01L 21/268* (2006.01)
(52) U.S. Cl.
USPC ....... 438/36; 438/797; 438/799; 257/E21.347
(58) Field of Classification Search
USPC ....... 257/E21.347; 438/36, 89, 166, 797, 799
See application file for complete search history.

(56) References Cited

U.S. PATENT DOCUMENTS

| 5,210,766 A | 5/1993 | Winer et al. |
| 5,456,763 A | 10/1995 | Kaschmitter et al. |
| 5,561,081 A | 10/1996 | Takenouchi et al. |
| 5,821,562 A | 10/1998 | Makita et al. |
| 6,169,014 B1 | 1/2001 | McCulloch |
| 6,255,148 B1 | 7/2001 | Hara et al. |
| 6,451,631 B1 | 9/2002 | Grigoropoulos et al. |
| 6,455,359 B1 | 9/2002 | Yamazaki et al. |
| 6,599,790 B1 | 7/2003 | Yamazaki et al. |
| 6,635,932 B2 | 10/2003 | Grigoropoulos et al. |
| 6,660,085 B2 | 12/2003 | Hara et al. |
| 6,812,491 B2 | 11/2004 | Kato et al. |
| 6,835,675 B2 | 12/2004 | Yamazaki et al. |
| 6,908,835 B2 * | 6/2005 | Sposili et al. ................. 438/487 |
| 7,023,500 B2 | 4/2006 | Kikuchi et al. |
| 7,063,999 B2 * | 6/2006 | Tanabe et al. ................... 438/62 |

(Continued)

FOREIGN PATENT DOCUMENTS

JP    2004153062 A    5/2004

OTHER PUBLICATIONS

International Search Report and Written Opinion of the International Searching Authority for PCT/US2010/057857 mailed Jun. 27, 2011 (APPM/014709-PCT).

*Primary Examiner* — Julio J Maldonado
*Assistant Examiner* — Daniel Shook
(74) *Attorney, Agent, or Firm* — Patterson & Sheridan, LLP

(57) ABSTRACT

A method and apparatus for forming a crystalline semiconductor layer on a substrate are provided. A semiconductor layer is formed by vapor deposition. A pulsed laser melt/recrystallization process is performed to convert the semiconductor layer to a crystalline layer. Laser, or other electromagnetic radiation, pulses are formed into a pulse train and uniformly distributed over a treatment zone, and successive neighboring treatment zones are exposed to the pulse train to progressively convert the deposited material to crystalline material.

10 Claims, 11 Drawing Sheets

(56) References Cited

U.S. PATENT DOCUMENTS

| | | |
|---|---|---|
| 7,129,153 B2 | 10/2006 | Lin |
| 7,262,431 B2 | 8/2007 | Hara et al. |
| 7,312,418 B2 | 12/2007 | Tanabe et al. |
| 7,396,712 B2 | 7/2008 | Tanabe et al. |
| 7,507,648 B2 | 3/2009 | Kakkad |
| 7,551,655 B2 | 6/2009 | Tanaka et al. |
| 7,579,654 B2 | 8/2009 | Couillard et al. |
| 7,651,928 B2 | 1/2010 | Fujino et al. |
| 7,700,892 B2 | 4/2010 | Jung |
| 7,830,606 B2 | 11/2010 | Ono et al. |
| 2003/0003636 A1 | 1/2003 | Grigoropoulos et al. |
| 2005/0000408 A1 | 1/2005 | Lin |
| 2005/0224816 A1 | 10/2005 | Kim et al. |
| 2006/0254500 A1 | 11/2006 | Im et al. |
| 2007/0212858 A1 | 9/2007 | Fujino et al. |
| 2007/0212860 A1 | 9/2007 | Fujino et al. |
| 2009/0137105 A1 | 5/2009 | Im |
| 2009/0218577 A1 | 9/2009 | Im |
| 2009/0242805 A1 | 10/2009 | Im |
| 2010/0159619 A1 | 6/2010 | Umezu et al. |
| 2010/0219506 A1 | 9/2010 | Gupta et al. |
| 2010/0270557 A1 | 10/2010 | Im |

\* cited by examiner

CRYSTALLIZATION PROCESSING FOR SEMICONDUCTOR APPLICATIONS

CROSS-REFERENCE TO RELATED APPLICATIONS

This application is a continuation of U.S. patent application Ser. No. 12/953,103, filed Nov. 23, 2010, which claims the benefit of U.S. provisional patent application Ser. No. 61/265,312, filed Nov. 30, 2009, both of which are incorporated herein by reference.

FIELD

Embodiments described herein relate to manufacture of semiconductor devices. More specifically, embodiments described herein relate to forming crystalline semiconductor layers for energy, memory, logic, or photonic devices.

BACKGROUND

Photovoltaic energy generation was the fastest growing energy source in 2007. In 2008, installed photovoltaic capacity increased approximately ⅔ to about 15 GW. By some estimates, the global market for photovoltaic power will grow at a compound annual rate of 32% between 2008 and 2013, reaching over 22 GW, while installed capacity grows at an average rate of 20-30% per year or more, possibly reaching 35 GW by 2013. With available solar resources estimated at 120,000 TW, using less than 0.013% of these available resources could replace fossil fuels and nuclear energy as sources of electrical power. Total global energy consumption of 16 TW in 2005 is less than 0.02% of available solar energy incident on the earth.

With so much potential, countries and companies around the world are racing to increase efficiency, and lower cost of, photovoltaic power generation. In a typical solar cell, a semiconductor material is exposed to sunlight to mobilize electrons. Some portions of the semiconductor material are doped with electron-rich elements, and other portions are doped with electron-deficient elements to provide a driving force for the mobilized electrons to flow toward current collectors. The electrons flow from the current collectors out to an external circuit to provide electrical power.

The crystal structure of the semiconductor material influences the light absorption characteristics of the cell and the efficiency with which it converts light into electricity. In an amorphous semiconductor material, there are few straight paths for electrons to travel, so electron mobility is less, and the energy required to render the electrons mobile is higher. Amorphous silicon materials thus have a larger band gap and absorb light that has a shorter wavelength than light absorbed by a crystalline silicon material. Microcrystalline materials or nanocrystalline materials have some crystal structure, which gives rise to higher electron mobility on average, and lower band gap. Polycrystalline and monocrystalline materials have even higher mobility and lower band gap.

While it is desirable to include absorbers having different morphologies to capture more of the incident spectrum, only small amounts of, for example, amorphous materials are needed to provide the absorbance benefit. Too much amorphous material results in lower efficiency because electrons travel comparatively slowly through the amorphous material, losing energy as they go. As they lose energy, they become vulnerable to Shockley-Read-Hall recombination, falling out of the conduction band back into the valence of an atom, recombining with a "hole", or local electron deficiency, and losing the absorbed solar energy that mobilized them.

To reduce this effect, it is thus desirable to maximize the polycrystalline and monocrystalline morphologies in a solar cell. This is generally problematic, however, because production of polycrystalline and monocrystalline materials is slow, due to the need to grow crystals. The comparatively slow production rates require large investment for a given productive capacity, driving up the cost of producing efficient solar cells and panels.

Production of polycrystalline and monocrystalline materials is also useful for certain memory applications, such as 3D memory, and for vertical monolithic integration of various semiconductor devices, such as photonic devices.

Thus there is a need for a method of manufacturing polycrystalline and monocrystalline semiconductor phases efficiently and at high rates.

SUMMARY

Embodiments described herein provide a method of reorganizing the structure of a solid material by exposing the solid material to pulses of energy to progressively melt the solid material, forming a molten material, and recrystallizing the molten material.

Other embodiments provide a method of forming a solar cell, comprising forming large crystal domains in an active layer of the solar cell by progressively melting and recrystallizing the active layer using pulses of spatially uniform laser light.

Other embodiments provide a method of forming a memory device, comprising forming a first conductive layer on a substrate, forming a polycrystalline or monocrystalline semiconductor layer on the substrate by a process comprising depositing a semiconductor layer on the substrate, progressively melting the semiconductor layer by exposing the semiconductor layer to pulses of energy, forming a molten semiconductor layer, and recrystallizing the molten semiconductor layer, and forming a second conductive layer on the substrate.

Other embodiments provide a method of forming a photonic device, comprising forming a compound semiconductor layer over a ceramic substrate, and crystallizing the compound semiconductor layer by directing pulses of energy toward the compound semiconductor layer, progressively melting the compound semiconductor layer to form a molten layer, and crystallizing the molten layer to form a crystalline compound semiconductor layer.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
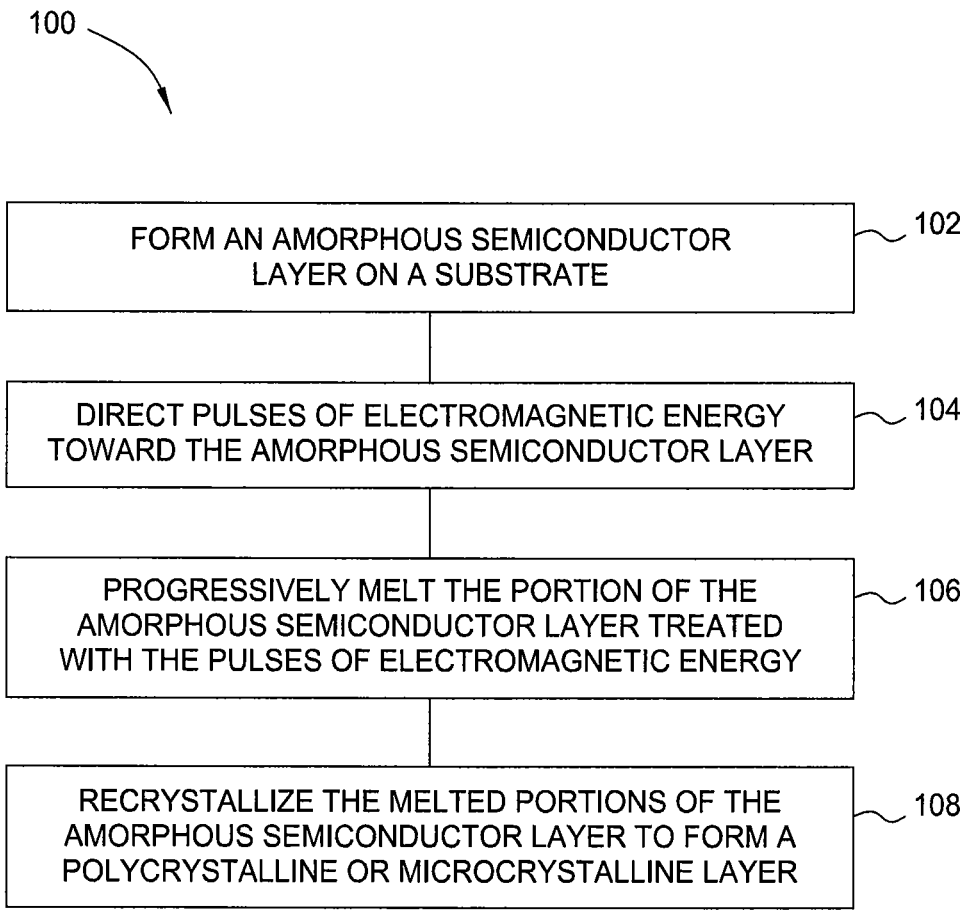
FIG. 1A is a flow diagram summarizing a method according to one embodiment.

Embodiments described herein generally provide methods and apparatus for forming solar cells, memory devices, and photonic devices such as light-emitting diodes (LEDs). FIG. 1A is a flow diagram summarizing a method 100 according to one embodiment. The method 100 is generally useful for rapidly forming crystalline semiconductor layers on a substrate. The method 100 may be used in crystalline or thin-film solar cell manufacturing processes to make high-efficiency solar cells, memory devices, logic devices, and photonic devices having crystalline semiconductor phases. At 102, a semiconductor layer is formed on a substrate. The substrate may be used in a thin film solar cell device, wherein the substrate is a glass substrate having a transparent conductive coating that forms an electrical contact layer that is disposed on one surface of the substrate. In general, for thin film solar cells, a transparent, or nearly transparent, substrate yields the highest sunlight absorption and thus improves the solar cell's power output. The semiconductor material used to form one of the above mentioned devices may comprise an element, such as silicon, germanium, or other elemental semiconductor, or a compound semiconductor, such as silicon-germanium, a CIGS material, or a group III/V semiconductor. The semiconductor material may, additionally, be doped with a p-type dopant, such as boron, or with an n-type dopant, such as phosphorus, to form an electron-rich or electron-deficient layer. The semiconductor material may have a crystal morphology that includes amorphous, polycrystalline, microcrystalline, and large-grain microcrystalline. In some embodiments, the semiconductor material may form an active layer of a solar cell or panel.

The semiconductor material may be formed on the substrate using any convenient process. In most embodiments, a vapor deposition process, such as physical or chemical vapor deposition, with or without plasma assistance, is used. In one particular embodiment, plasma-assisted chemical vapor deposition is used to deposit an amorphous silicon layer from a gas mixture comprising a silicon source, such as silane, hydrogen gas, and optionally an inert gas, such as argon or helium. A dopant source, such as borane, diborane, phosphine, or arsine, may be added to the gas mixture to deposit a doped silicon layer. In one exemplary embodiment used to form an intrinsic silicon layer in a solar cell device, silane is provided to a processing chamber at a flow rate of between about 1 sccm/L and about 10 sccm/L (normalized to the processing volume of the chamber, in liters), with the ratio of hydrogen to silane about 20:1 or less by volume. RF power may be applied to the gas mixture, for example by coupling an RF source to the gas distributor, at a power level between about 15 mW/cm$^2$ and about 200 mW/cm$^2$ (normalized to surface area of the substrate being processed, in square-centimeters) at a pressure between about 1 Torr and about 4 Torr. The semiconductor material may be formed to a thickness up to about 1 μm.

At 104, the semiconductor layer is exposed to pulses of electromagnetic radiation. A plurality of treatment zones is generally defined on the substrate and exposed to the pulses sequentially. In one embodiment, the pulses may be pulses of laser light, each pulse having a wavelength between about 200 nm and about 1200 nm, for example about 1064 nm as delivered by a frequency-doubled Nd:YAG laser. Other wavelengths, such as infrared, ultraviolet, and other visible wavelengths, may also be used. Other types of radiation, such as microwave radiation, may also be used. The pulses may be delivered by one or more sources of electromagnetic radiation, and may be delivered through an optical or electromagnetic assembly to shape or otherwise modify selected characteristics of the pulses.

At 106, the semiconductor layer is progressively melted by treatment with the pulses of electromagnetic radiation. Each pulse of electromagnetic radiation, for example laser light, may have energy enough to melt the portion of the substrate on which it impinges. For example, each pulse may deliver energy between about 0.3 J/cm$^2$ and about 1.0 J/cm$^2$. A single pulse impacts the substrate surface, transferring much of its energy into the substrate material as heat. The first pulse impacting the surface impacts a solid material, heating it to a temperature at or above its melting point, melting the impacted surface region. Depending on the energy delivered by the first pulse, the surface region may melt to a depth of between about 60 Å and about 600 Å, leaving a layer of molten material on the surface. The next pulse to reach the surface impacts the molten material, delivering heat energy that propagates through the molten material into the underlying solid material, melting more of the solid material. In this way, successive pulses of electromagnetic radiation may form a melt front that moves through the semiconductor layer with each successive pulse.

Figure 1B:
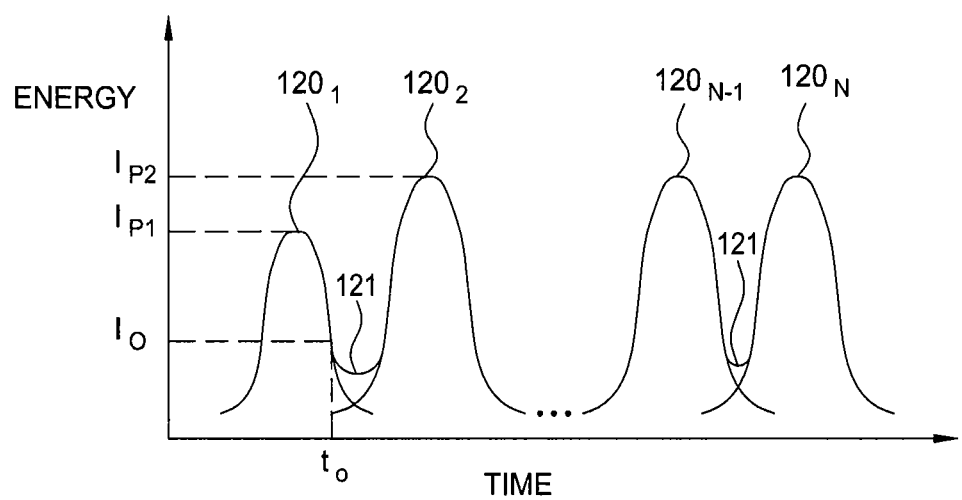
FIG. 1B schematically illustrates pulses of energy according to an embodiment described herein.

FIG. 1B is a schematic view of an example of an array of uniform electromagnetic energy pulses $120_1$-$120_N$ that are delivered to the substrate surface by one or more electromagnetic radiation device, such as one or more of the emitters 224 discussed below. It should be noted that the amount of energy delivered within each pulse (e.g., pulse $120_1$, $120_2$ ... $120_N$) can be varied as a function of time, and thus the profile of each pulse (e.g., energy versus time) can be varied as necessary to improve the delivery of energy to the molten material. For example, the shape of pulse $120_1$ need not be Gaussian shaped, as shown in FIG. 1B, and can be configured to deliver more energy at start of the pulse or at the end of the pulse (e.g., triangular shaped).

Each pulse may have the same amount of energy as the pulse before it, or one or more pulses may contain a different amount of energy. For example, the first pulse may have a lower amount of energy than subsequent pulses, as shown in FIG. 1B, because the first pulse does not need to propagate through a layer of molten material to reach a solid phase. In some embodiments, the plurality of pulses delivered to a region of the semiconductor layer may comprise a first portion and a second portion, wherein each pulse of the first portion has a different energy and each pulse of the second portion has the same energy. As described above, the first portion may comprise only one pulse with energy different from the pulses of the second portion. In another embodiment, the first portion may have multiple pulses, each with more energy that the prior pulse, so that each pulse of the first portion delivers more energy than the last.

In one embodiment, each pulse has a duration between about 1 nsec and about 50 nsec, such as between about 20 nsec and about 30 nsec. In another embodiment, each pulse delivers power between about $10^7$ W/cm$^2$ and about $10^9$ W/cm$^2$. The pulses may be separated by a rest duration, which may be selected to allow a portion of the energy delivered by each pulse to dissipate within the semiconductor layer. In one embodiment, the rest duration is chosen such that a pulse impacts the surface of the semiconductor layer before enough heat is conducted away from the molten material to re-freeze 25% of the molten material. In another embodiment, each pulse generates a temperature wave, part of which propagates through the phase boundary between liquid and solid, and part of which is reflected back through the liquid phase, and the rest duration is chosen such that a second pulse impacts the surface before the reflected temperature wave from an immediately prior first pulse reaches the surface. In one embodiment, the pulses overlap in time, so that the radiant intensity from a second pulse arrives at the surface before the radiant intensity from an immediately prior first pulse decays to zero. An overlap factor may be defined as the percent peak intensity of the first pulse impacting the surface at the time radiant intensity from the second pulse begins impacting the surface. In one embodiment, the pulses may have overlap factor between about 0% and about 50%, such as between about 10% and about 40%, for example about 25%.

The pulses illustrated in FIG. 1B overlap in time, as may be practiced in many embodiments. The first pulse $120_1$ has a peak intensity $I_{P1}$ of energy delivered to the surface of the substrate. As the energy intensity at the substrate surface declines from the peak intensity $I_{P1}$, energy from the second pulse $120_2$ begins impacting the substrate surface at time $t_O$, before the energy from the first pulse has subsided. At time $t_O$, the energy intensity from the first pulse is $I_O$. Thus, the overlap factor for the first two pulses is $100 \times (I_O/I_{P1})$, as defined above. The cumulative energy incident on the substrate surface from the added effect of the first and second pulses $120_1$ and $120_2$ thus reaches a non-zero minimum $I_{min}$, as shown by the cumulative energy curve 121.

In some embodiments wherein pulses overlap in time, each pulse may extend the melt front between about 60 Å and about 600 Å, while the melt front may recede between about 30 Å and about 100 Å during the rest duration as heat conducts from the liquid phase into the solid phase. The number of pulses, the intensity and duration of each pulse, and the overlap factor of the pulses inter-depend on the thickness of the material to be melted, ambient pressure of the processing environment, crystal structure of the material to be melted and composition of material to be melted.

The non-uniformity of a pulse may be defined as the average percent deviation of radiant intensity at each point in the treatment zone from the average intensity over the entire treatment zone. A laser spot unaltered by any optics naturally has a Gaussian intensity distribution at any point in time. It should be noted that the Gaussian intensity distribution of a laser spot on a surface is not to be confused with the Gaussian energy-time profile of a pulse, as described above. The two profiles are independent, the intensity distribution being determined at a single point in time, or averaged over a duration, and the energy-time profile representing energy over time delivered to a point on the surface, or averaged over the surface. For an unaltered laser spot, if a treatment zone is defined as all points receiving at least 5% of peak intensity from a Gaussian spot at any given point in time, then the average intensity across the treatment zone at any point in time will be about 45% of peak intensity, and the non-uniformity of the Gaussian spot will be about 80%.

In one embodiment, each pulse of electromagnetic radiation is spatially uniform or uniformly distributed over a treatment zone of the substrate. Each pulse may have non-uniformity less than about 5%, for example less than about 3%, or between about 1% and about 2.5%. In one embodiment, each treatment zone may have a rectangular shape, and in some embodiments, each treatment zone may have a square shape. In one particular embodiment, each treatment zone is a square approximately 2 cm on each side, and each laser pulse is distributed over the 4 cm$^2$ treatment zone with non-uniformity less than about 2.5%. In such an embodiment, the surface of the treatment zone is melted to a very uniform depth with each pulse.

In one embodiment, a train of overlapping pulses of electromagnetic energy form a continuous amplitude modulated beam of electromagnetic energy, wherein the frequency of the amplitude modulation is related to the number and duration of pulses and the characteristics of the optical column used to form the pulses into an energy train. The pulse additive amplitude modulated energy beam may be further homogenized to achieve the desired spatial uniformity as described above.

At 108, the melted portion of the semiconductor layer is recrystallized to form a crystalline layer, such as a polycrystalline, multicrystalline or monocrystalline layer. The melted portion begins freezing at the solid-liquid interface with other portions of the semiconductor layer. Because crystalline materials conduct heat better than amorphous materials, and crystalline materials with large grains conduct heat better than crystalline materials with small grains, for reasons similar to those described above with respect to electron mobility, incrementally more heat is conducted away by adjacent crystalline domains, resulting in earlier freezing near phase boundaries with crystalline domains. As freezing occurs, atoms align with the crystal structure of the solid domain, propagating the adjacent crystal structure through the liquid phase as it freezes. In this way, each recrystallized polycrystalline or monocrystalline treatment zone seeds recrystallization of the next treatment zone.

In one embodiment, recrystallization of the melted portion may be facilitated directionally by delivering pulses of energy during the recrystallization operation. Because surface regions may lose heat faster than internal regions of the molten layer due to radiation and/or conduction of heat into the ambient environment, pulses of energy may be delivered to the substrate as recrystallization progresses to keep surface regions from freezing before internal regions. Pulses delivered during recrystallization will have different profiles from pulses delivered during melting, to avoid re-melting the layer. For example, N pulses each having duration $D_N$ may be delivered to melt the layer, and M pulses each having duration $D_M$ may be delivered during recrystallization, where $D_N > D_M$. Likewise, the instantaneous intensity or amount of energy delivered in each pulse may be lower, and/or the frequency of pulses may be lower. By controlling the melting and recrystallization process the grain size of the recrystallized layer can be controlled. In one embodiment, the treatment process is used to recrystallize a silicon layer so that the grain size of the processed layer is greater than about 1 micrometer (μm), and more preferable greater than about 1000 μm. It is believed that larger grain sizes in the recrystallized layer will improve the carrier lifetime and efficiency of a formed solar cell device by reducing the grain boundary surface area that act as carrier recombination sites.

In one embodiment, a crystalline seed may be established on the substrate prior to forming the semiconductor layer on the substrate. Melt annealing may begin with a treatment zone in contact with the crystalline seed to start the crystal growth process. Treatment may then proceed by adjusting the electromagnetic energy delivery position to form adjacent treatment zones across the substrate to recrystallize the entire layer. In this way, a semiconductor phase may be converted to a crystalline morphology more rapidly than by depositing a crystalline phase from a vapor phase. In one example, it has been found that the deposition rate in a 2.2 m×2.6 m a PECVD deposition chamber for an amorphous silicon layer is about 650 angstroms/min (Å/minute) and the deposition rate of a microcrystalline silicon film in the same chamber is about 360 Å/minute. Therefore, it can take an additional 52 minutes to form a 1.5 micron (μm) microcrystalline silicon layer used in a bottom cell of a tandem junction solar cell versus an amorphous silicon layer using a vapor phase deposition process. Therefore, as long as the melt annealing device (e.g., reference numeral 455 in FIG. 4A) can treat the complete substrate surface, at a rate equal or greater than the throughput of solar cells through the production system 490 (FIG. 4A), the production line throughput can increased using the processes described herein.

Figure 2:
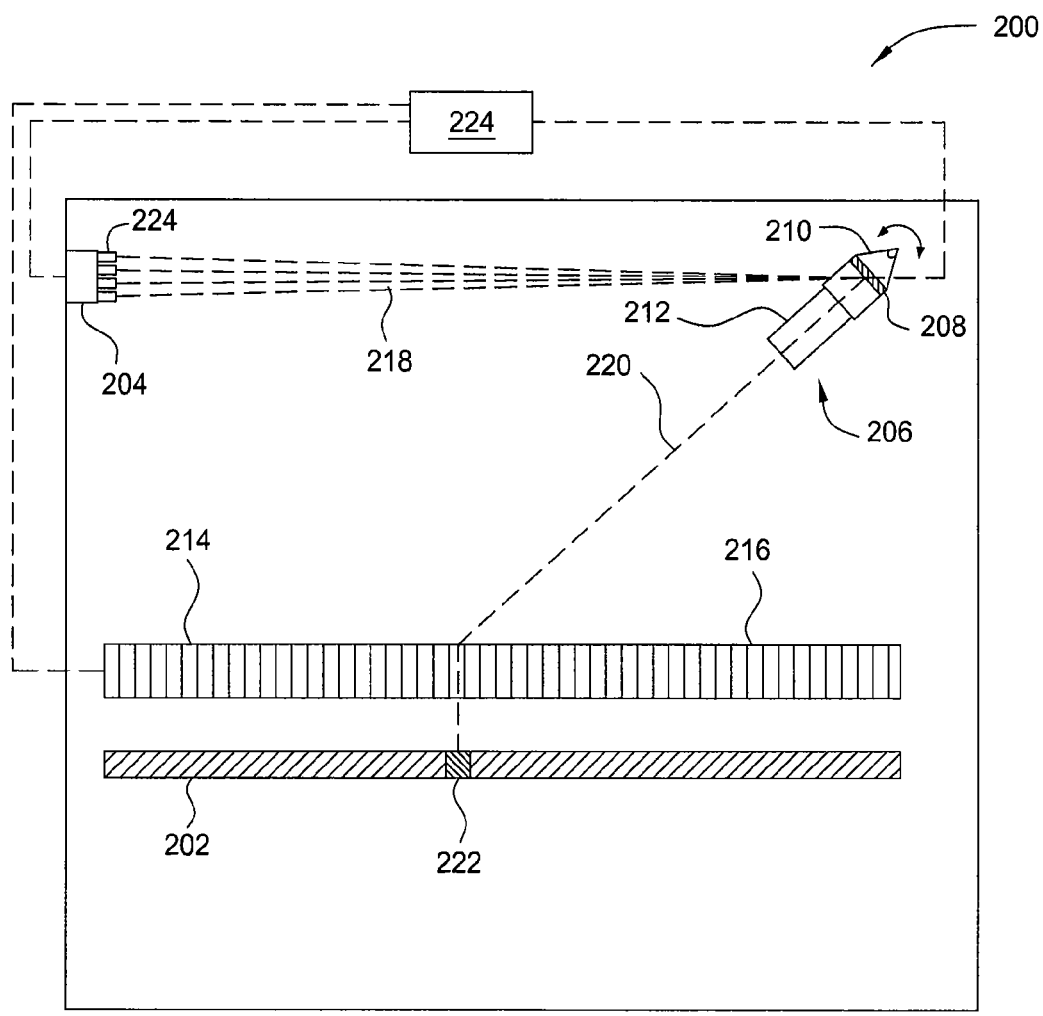
FIG. 2 is a schematic cross-sectional view of an apparatus according to another embodiment.

FIG. 2 is a schematic cross-sectional view of an apparatus 200 according to another embodiment. The apparatus 200 may be used to form devices and layers as described elsewhere herein. The apparatus generally comprises a chamber 201 with a substrate support 202 disposed therein. A source of electromagnetic energy 204 is disposed in the chamber, or in another embodiment may be disposed outside the chamber and may deliver the electromagnetic energy to the chamber through a window in the chamber wall. The source of electromagnetic energy 204 directs one or more beams of electromagnetic energy 218, such as laser beams or microwave radiation, from one or more emitters 224 toward an optical assembly 206. The optical assembly 206, which may be an electromagnetic assembly, forms the one or more beams of electromagnetic energy into a train 220 of electromagnetic energy, directing the train 220 of energy toward a rectifier 214. The rectifier 214 directs the train 220 of energy toward a treatment zone 222 of the substrate support 202, or of a substrate disposed thereon. In one example, the apparatus 200 is configured to anneal a 2.2 m×2.6 m device within about 1 minute (e.g., 5.72 m$^2$/min), or 60 substrates an hour.

The optical assembly 206 comprises a moveable reflector 208, which may be a mirror, and an optical column 212 aligned with the reflector 208. The reflector 208 is mounted on a positioner 210 which, in the embodiment of FIG. 2, rotates to direct a reflected beam toward a selected location. In other embodiments, the reflector may translate rather than rotating, or may both translate and rotate. The optical column 212 forms and shapes pulses of energy from the energy sources 204, reflected by the reflector 208, into a desired energy train 220 for treating a substrate on the substrate support 202. An optical column that may be used as the optical column 212 for forming and shaping pulses is described in co-pending U.S. patent application Ser. No. 11/888,433, filed Jul. 31, 2007, and published Feb. 5, 2009, as United States Patent Application Publication No. 2009/0032511, which is hereby incorporated by reference.

The rectifier 214 comprises a plurality of optical cells 216 for directing the energy train 220 toward the treatment zone 222. The energy train 220 is incident on one portion of an optical cell 216, which changes the direction of propagation of the energy train 220 to a direction substantially perpendicular to the substrate support 202 and the treatment zone 222. Provided a substrate disposed on the substrate support 202 is flat, the energy train 220 leaves the rectifier 214 travelling in a direction substantially perpendicular to the substrate, as well.

The optical cells 216 may be lenses, prisms, reflectors, or other means for changing the direction of propagating radiation. Successive treatment zones 222 are treated by pulses of electromagnetic energy from the energy source 204 by moving the optical assembly 206 such that the reflector 208 directs the energy train 220 to successive optical cells 216.

In one embodiment, the rectifier 214 may be a two-dimensional array of optical cells 216 extending over the substrate support 202. In such an embodiment, the optical assembly 206 may be actuated to direct the energy train 220 to any treatment zone 222 of the substrate support 202 by reflecting the energy train 220 toward the optical cell 216 above the desired location. In another embodiment, the rectifier 214 may be a line of optical cells 216 with dimension greater than or equal to a dimension of the substrate support. A line of optical cells 216 may be positioned over a portion of a substrate, and the energy train 220 scanned across the optical cells 216 to treat portions of the substrate located below the rectifier 214, multiple times if desired, and then the line of optical cells 216 may be moved to cover an adjacent row of treatment zones, progressively treating an entire substrate by rows.

The energy source 204 of FIG. 2 shows four individual beam generators because in some embodiments, individual pulses in a pulse train may overlap. Multiple beam or pulse generators may be used to generate pulses that overlap. Pulses from a single pulse generator may also be made to overlap by use of appropriate optics in some embodiments. Use of one or more pulse generators will depend on the exact characteristics of the energy train needed for a given embodiment.

The interdependent function of the energy source 204, the optical assembly 206 and the rectifier 214 may be governed by a controller 226. The controller may be coupled to the energy source 204 as a whole, or to individual energy generators of the energy source 204, and may control power delivery to the energy source, or energy output from the energy generators, or both. The controller 226 may also be coupled to an actuator (not shown) for moving the optical assembly 206, and an actuator (not shown) for moving the rectifier 214, if necessary.

Figure 3A:
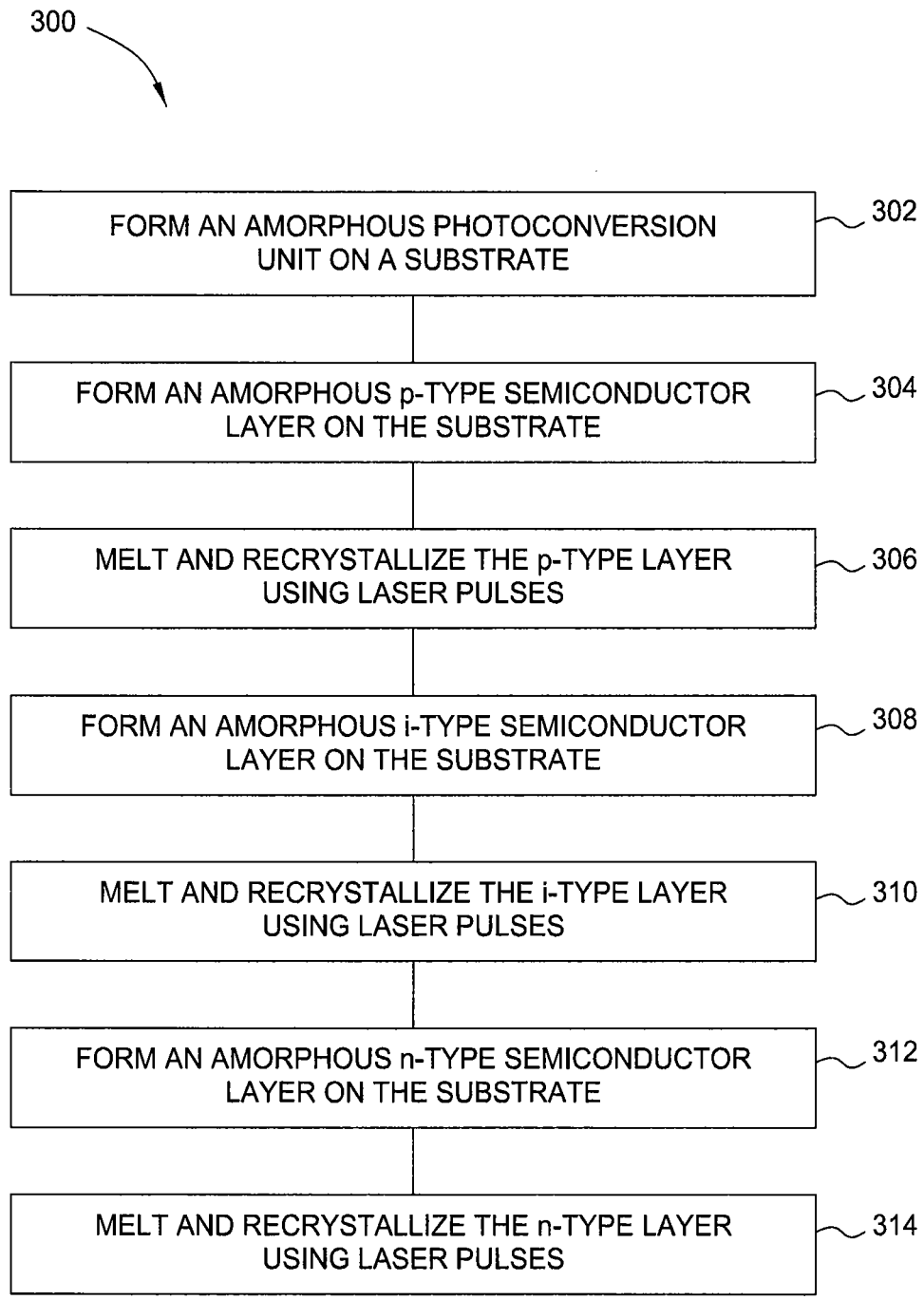
FIG. 3A is a flow diagram summarizing a method according to another embodiment.

FIG. 3A is a flow diagram summarizing a method 300 according to another embodiment. The method 300 of FIG. 3A is useful for forming vertically integrated monolithic crystalline semiconductor structures, such as thin-film solar cells. A similar method may be used to form any vertically integrated monolithic crystalline semiconductor material, such as may be found in memory and photonic devices.

At 302, a photoconversion unit, which may be amorphous, microcrystalline, or polycrystalline, is formed on a substrate. The photoconversion unit may comprise a p-i-n junction formed from a doped semiconductor such as silicon, germanium, a CIGS semiconductor, or a combination thereof.

At 304, a p-type semiconductor layer is formed on the substrate by depositing a semiconductor material using a vapor deposition process, such as physical or chemical vapor deposition, which may be plasma enhanced, wherein the vapor comprises a semiconductor source and a dopant source. The p-type semiconductor layer may be amorphous, microcrystalline, or polycrystalline.

At 306, the p-type layer is melted and recrystallized using laser pulses. A pulse train, or group of pulses, is formed by optically adding laser pulses and homogenizing the resulting pulse train to form a spatially homogenized variable power electromagnetic energy beam. The variation in power, or energy per unit time, of each pulse train is designed to deliver electromagnetic energy to the p-type layer that varies to progressively melt the p-type layer. When the rate of energy incident on the p-type layer from a pulse or group of pulses, surpasses the rate of heat diffusion through the p-type layer, and the local temperature of the irradiated portion rises to a point greater than the meting point of the material, a molten area forms in the p-type layer. If the energy of the pulse(s) decreases, the rate of energy input near the interface between the solid phase and the melt phase may fall below the rate of heat diffusion from the melt phase into the solid phase, and a portion of the molten area may resolidify.

The precise details of the amplitude-time function of the energy beam governs the degree to which re-freezing occurs during local intensity minima, and may be used to select the mode of melting performed. For example, in one embodiment the energy beam may be designed to progress the melt front by about 500 Å and re-freeze about 10 Å. In another embodiment, the melt front may be progressed by about 500 Å by each local maximum, and each local minimum allows re-freezing of about 400 Å. Each successive energy maximum from one or more of the pulses may be designed to progress the melt front between about 60 Å and about 600 Å deeper into the layer until the layer is substantially melted.

In the melt/recrystallize process, a plurality of treatment zones is defined on the p-type layer, and each zone treated sequentially to convert the p-type layer into a crystalline material. Each treatment zone is treated after its immediate neighbor to provide a crystalline interface at the edge of the treatment zone to stimulate crystal growth after the melt operation. In one embodiment, each treatment zone is exposed to a plurality of overlapping pulses of electromagnetic energy, which may be formed into an energy modulated beam of radiation. For uniform treatment of each treatment zone, the energy of the beam is uniformly distributed spatially across the zone, as described above.

In one embodiment, a portion of the p-type layer near the underlying layers may remain unmelted to minimize diffusion and/or mixing of dopants of different types. For example, if the p-type layer is formed over an amorphous n-type layer in the underlying photoconversion unit, it may be desired to avoid melting up to about 100 Å of the p-type layer to avoid mixing or diffusion of p and n-type dopants at the interface. Even with use of a buffer layer between the p-type layer and the underlying photoconversion unit, leaving a thin p-type buffer layer unmelted may be useful.

In one embodiment, it may be useful to form a thin layer of crystalline material between the photoconversion unit of operation 302 and the p-type layer of operation 304. A layer of crystalline material, such as polycrystalline or monocrystalline silicon or other semiconductor, that is less than about 50 Å thick and is used to help promote growth of a crystal structure in the p-type layer during freezing of the molten material. The layer of crystalline material may be continuous or discontinuous, and may be formed by deposition or by a local recrystallization process. In a local recrystallization process, the crystalline material may form a point or dot, a line, or a periodic surface structure, for example by exposure to a spot beam of electromagnetic energy such as a laser.

Recrystallization of the p-type layer may be facilitated by modulating the energy beam by reducing the pulse frequency, pulse profile, or by using longer wavelengths of light. Therefore, by reducing and controlling the rate of energy input maintains surface areas of the p-type layer in a molten state as recrystallization proceeds at the solid-melt interface. Thus, a progressive recrystallization process may be accomplished wherein crystallization proceeds from a location of the molten material near a subjacent layer to the surface of the molten material. Such a progressive recrystallization may enhance formation of large crystal grains by promoting ordered, directional crystal formation.

At 308, an i-type semiconductor layer, which may be amorphous, microcrystalline, or polycrystalline, is formed on the substrate using a process similar to that used to form the p-type layer, excluding the dopant source. The i-type layer is converted to a crystalline layer at 310 by melting and recrystallizing in a process similar to that of operation 306. Finally, an n-type semiconductor layer is formed at 312 and converted to crystalline form at 314 to complete the method.

The thickness of the layers formed in the method 300 may be up to about 50 µm thick, as needed for the particular embodiment. In a solar cell embodiment, the layers will generally be less than about 2.5 µm thick, and may be as thin as about 100 Å to about 500 Å in some cases. The melt/recrystallization process described above may be used to form a power generating region as the bulk of a solar cell, either as a stand-alone crystalline solar cell or with a thin amorphous cell in a tandem thin-film cell.

Figure 3B:
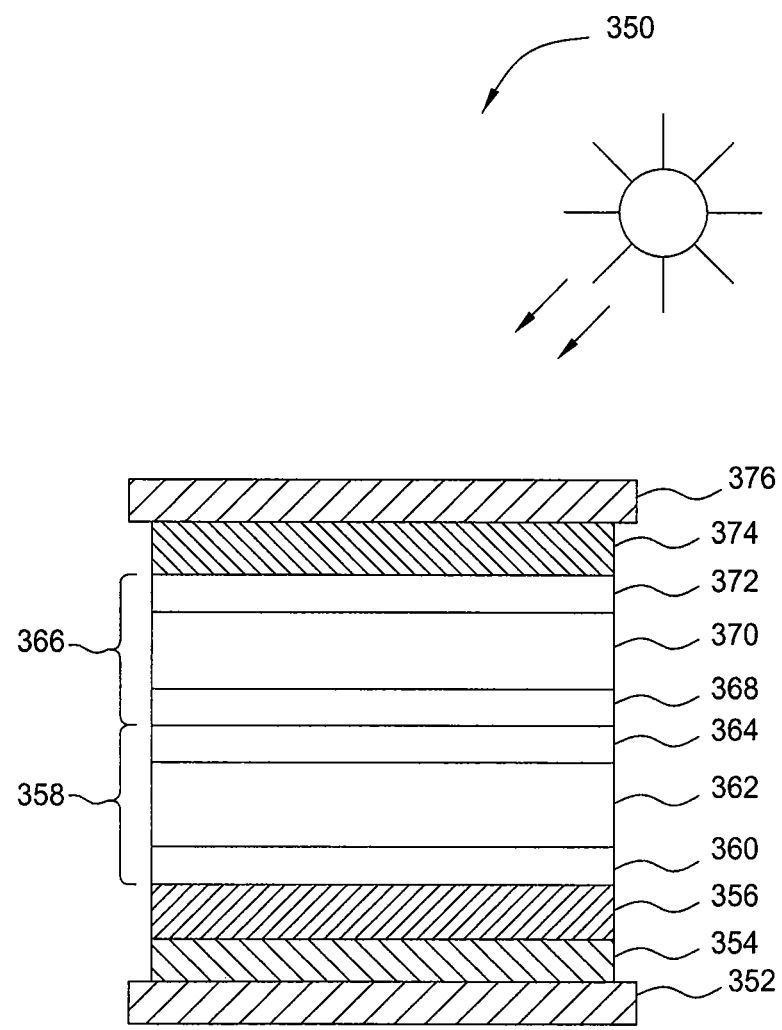
FIG. 3B is a schematic cross-sectional view of a thin film solar cell according to another embodiment.

FIG. 3B is a schematic side-view of a substrate 350 formed according to the method 300 of FIG. 3A. The substrate 350 comprises two power generating regions 358 and 366 between two conductive layers 374 and 356, and protective layers 376 and 352, and a strength-enhancing layer 354. Each of the power generating regions 358 and 366 comprises a p-type semiconductor layer 372, 364, an i-type semiconductor layer 370, 362, and an n-type semiconductor layer 368, 360. The layers of the power generating regions 358 and 366 generally have different crystal morphologies to facilitate the absorption of light across a wide wavelength spectrum. In one embodiment, layers 360, 370 and 372 are amorphous, and layers 362, 364, and 368 are microcrystalline, polycrystalline, multicrystalline, or monocrystalline. The crystalline layers may be formed by depositing amorphous layers and then recrystallizing each of the layers according to the method 300 of FIG. 3A.

In one embodiment, the n-type semiconductor layer 360 is an amorphous layer to provide oxygen barrier properties. In another embodiment, the p-type semiconductor layer 372 and the i-type semiconductor layer 370 are each amorphous to collect shorter wavelength light. In an alternate embodiment, the n-type semiconductor layer 368 is amorphous, while the n-type semiconductor layer 360 is crystalline to facilitate collecting a broad spectrum of light.

Figure 4A:
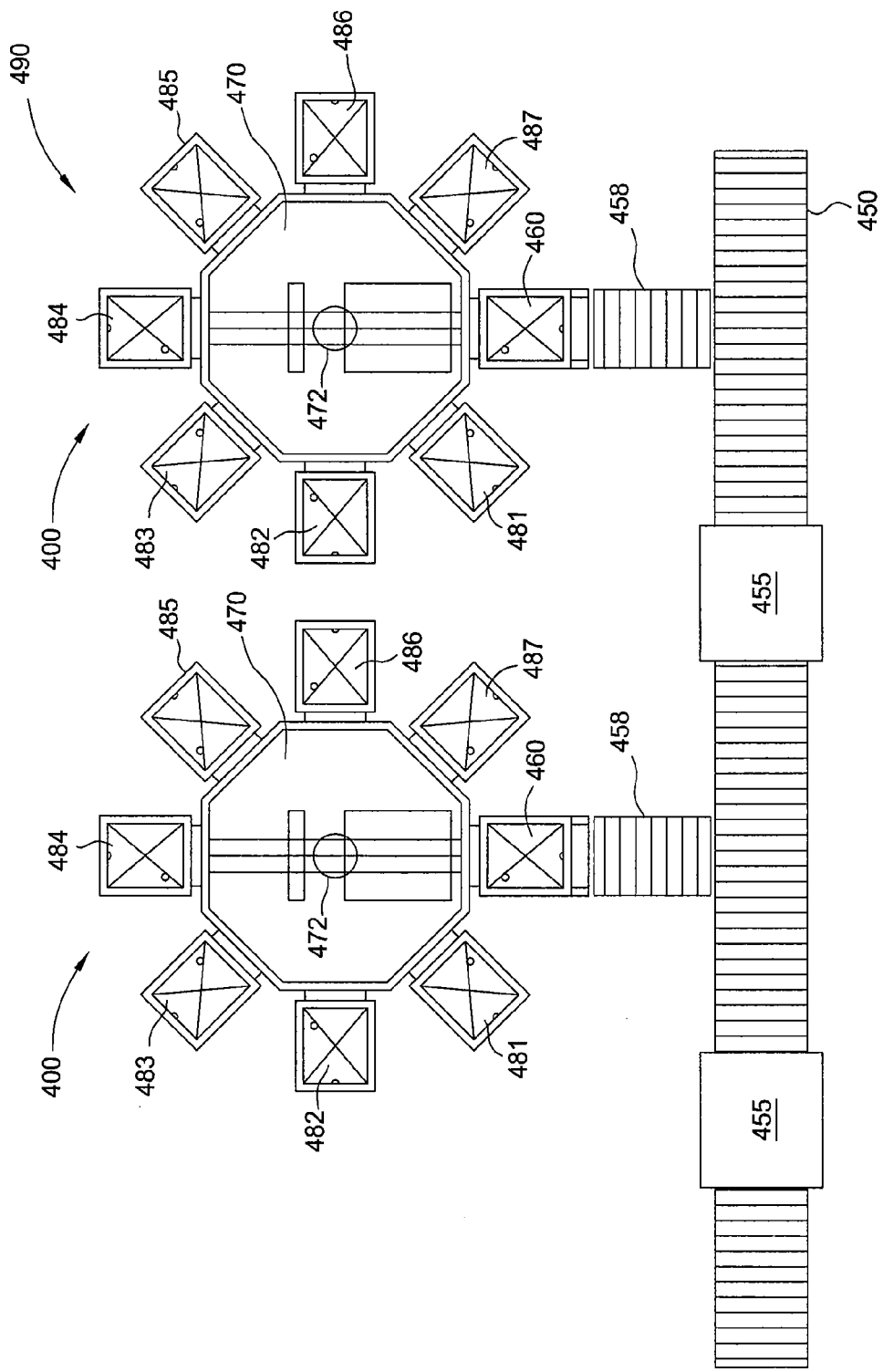
FIG. 4A is a plan view of a processing system according to another embodiment.

FIG. 4A is a plan view of a production system 490 for processing substrates according to another embodiment. The system 490 comprises a collection of substrate conveyors 450, 458, and processing stations 400, 455, which may be used to form a thin-film photovoltaic device. In the embodiment of FIG. 4A, two groups of processing stations 400, each of which may be a deposition station, are matched to two feed conveyors 458, which collect substrates from the main conveyor 450 for processing and deposit processed substrates back on the main conveyor 450 for delivery to the next processing stage. The embodiment of FIG. 4A is configured such that the processing stations 400 are deposition stations and the processing stations 455 are thermal treatment stations, and after processing in a processing station 400, a substrate is delivered to a processing station 455 for thermal treatment. Each processing station 455 may be a processing chamber for performing a crystallization operation as described above in connection with FIGS. 1A and 2. Each of the processing stations 400 may be used to form a p-i-n junction on a substrate for a thin-film photovoltaic device, as described above in connection with FIG. 3. Each processing station 400 comprises a transfer chamber 470 coupled to a load lock chamber 460 and the process chambers 481-487. The load lock chamber 460 allows substrates to be transferred between the ambient environment outside the system and vacuum environment within the transfer chamber 470 and process chambers 481-487. The load lock chamber 460 includes one or more regions that may be evacuated while enclosing one or more substrate. The load lock chamber 460 is pumped down when substrates enter from the ambient environment, and vented during delivery of substrates to the ambient environment from the processing station 400. The transfer chamber 470 has at least one vacuum robot 472 disposed therein that is adapted to transfer substrates between the load lock chamber 460 and the process chambers 481-487. While seven process chambers are shown in processing station 400 of FIG. 4A, each processing station 400 may have any suitable number of process chambers.

In one embodiment of a processing station 400, one of the process chambers 481-487 is configured to deposit a p-type silicon layer(s) of a first p-i-n junction 320 or a second p-i-n junction 330 of a solar cell device, another one of the process chambers 481-487 is configured to deposit an intrinsic silicon layer of the first or the second p-i-n junction, and another of the process chambers 481-487 is configured to deposit the n-type silicon layer(s) of the first or the second p-i-n junction. While a process configuration having three types of chamber processes (i.e., a p-type process, an i-type process, and an n-type process) may have some contamination control advantages, it will generally have a lower substrate throughput than a process configuration having two types of chamber processes (i.e., a p-type process and an i/n-type process), and is generally incapable of maintaining a desired throughput when one or more of the processing chambers are brought down for maintenance.

Figure 4B:
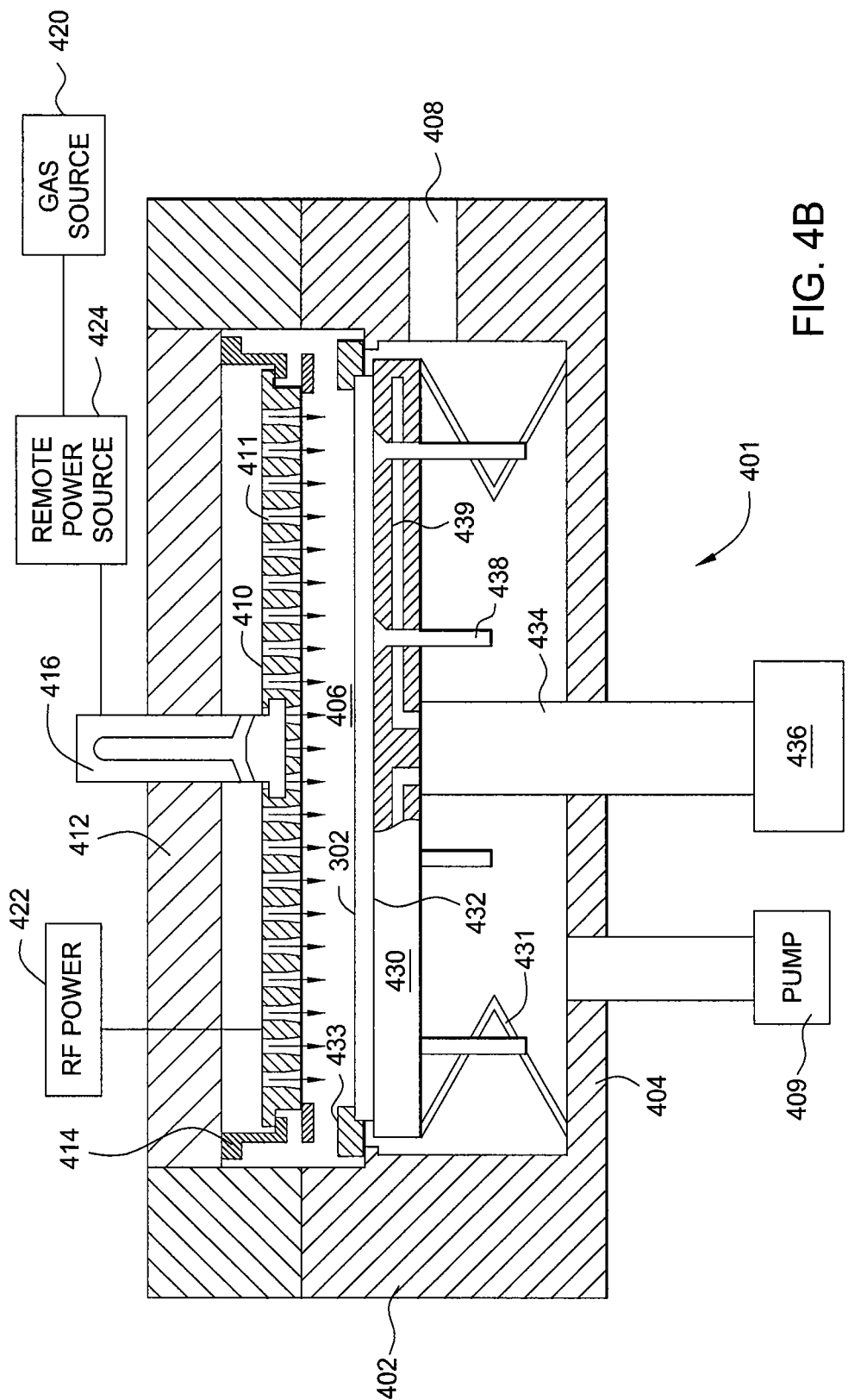
FIG. 4B is a schematic cross-sectional view of a processing chamber according to another embodiment.

FIG. 4B is a schematic cross-sectional view of one embodiment of a processing chamber, such as a PECVD chamber 401 in which one or more films of a solar cell may be deposited. In one embodiment, the chamber 401 generally includes walls 402, a bottom 404, and a showerhead 410, and substrate support 430 which define a process volume 406. The process volume is accessed through a valve 408 such that the substrate may be transferred in and out of the PECVD chamber 401. The substrate support 430 includes a substrate receiving surface 432 for supporting a substrate and stem 434 coupled to a lift system 436 to raise and lower the substrate support 430. A shadow frame 433 may be optionally placed over periphery of the device substrate 303 that may already have one or more layers formed thereon, for example, the conductive layer 356. Lift pins 438 are moveably disposed through the substrate support 430 to move a substrate to and from the substrate receiving surface 432. The substrate support 430 may also include heating and/or cooling elements 439 to maintain the substrate support 430 at a desired temperature. The substrate support 430 may also include grounding straps 431 to provide RF grounding at the periphery of the substrate support 430. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety to the extent not inconsistent with the present disclosure.

The showerhead 410 is coupled to a backing plate 412 at its periphery by a suspension 414. The showerhead 410 may also be coupled to the backing plate by one or more center supports 416 to help prevent sag and/or control the straightness/curvature of the showerhead 410. A gas source 420 is coupled to the backing plate 412 to provide gas through the backing plate 412 and through the plurality of holes 411 in the showerhead 410 to the substrate receiving surface 432. A vacuum pump 409 is coupled to the PECVD chamber 401 to control the process volume 406 at a desired pressure. An RF power source 422 is coupled to the backing plate 412 and/or to the showerhead 410 to provide a RF power to the showerhead 410 so that an electric field is created between the showerhead and the substrate support so that a plasma may be generated from the gases between the showerhead 410 and the substrate support 430. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 2005/0251990 published on Nov. 17, 2006 to Choi et al., and U.S. Publication 2006/0060138 published on Mar. 23, 2006 to Keller et al, which are all incorporated by reference in their entirety to the extent not inconsistent with the present disclosure.

A remote plasma source 424, such as an inductively coupled remote plasma source, may also be coupled between the gas source and the backing plate. Between processing substrates, a cleaning gas may be provided to the remote plasma source 424 so that a remote plasma is generated and provided to clean chamber components. The cleaning gas may be further excited by the RF power source 422 provided to the showerhead. Suitable cleaning gases include but are not limited to $NF_3$, $F_2$, and $SF_6$. Examples of remote plasma sources are disclosed in U.S. Pat. No. 5,788,778 issued Aug. 4, 1998 to Shang et al, which is incorporated by reference to the extent not inconsistent with the present disclosure.

Figure 5A:
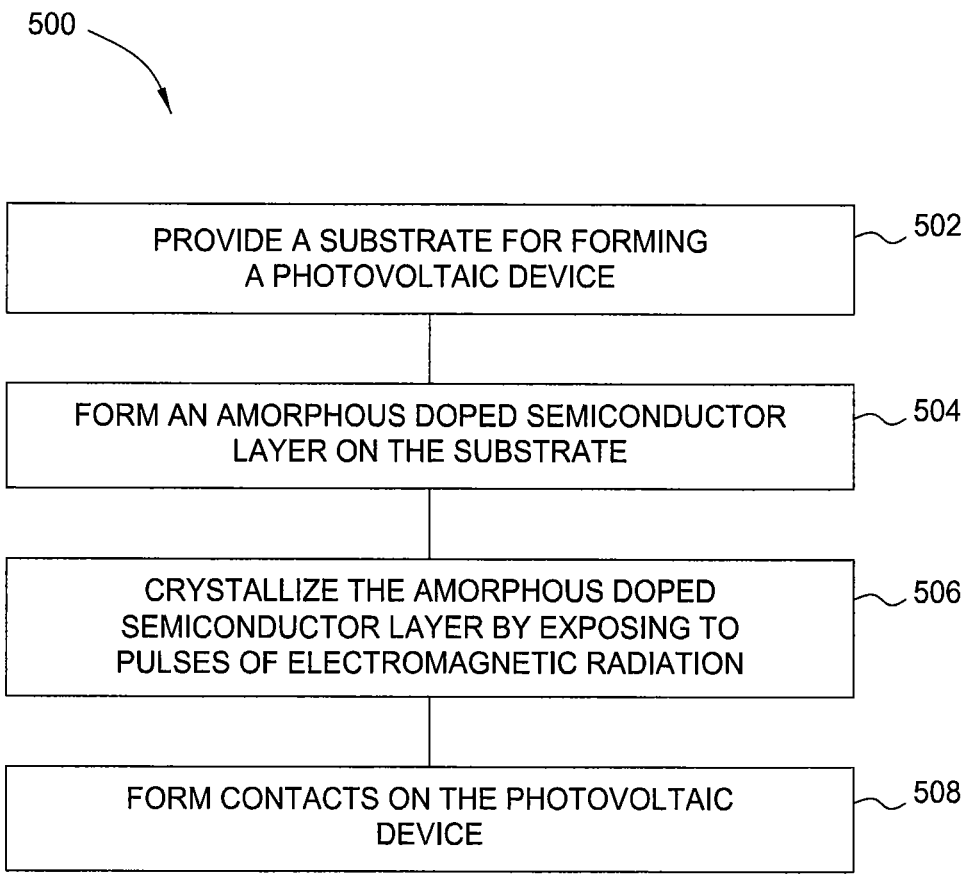
FIG. 5A is a flow diagram summarizing a method according to another embodiment.
Figure 5B:
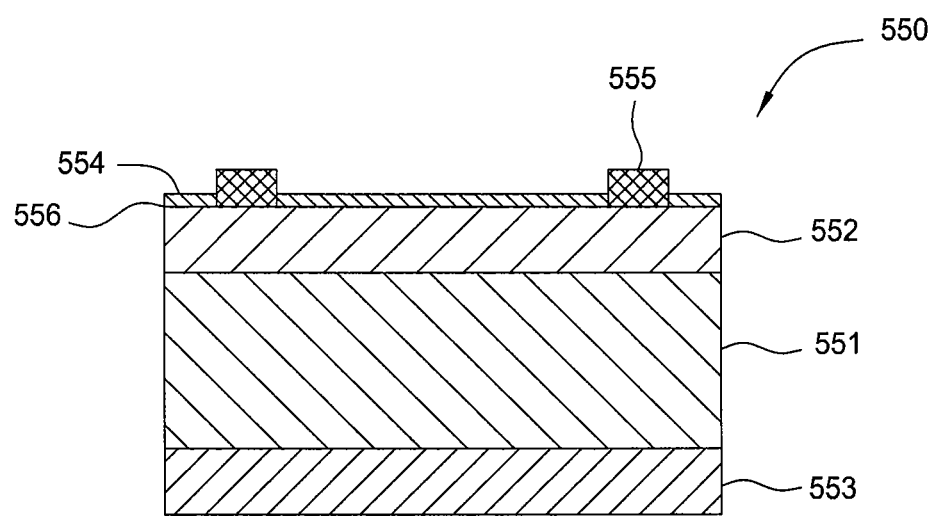
FIG. 5B is a schematic cross-sectional view of a crystalline solar cell according to another embodiment.

FIG. 5A is a process flow diagram summarizing a method 500 according to another embodiment. The method 500 is useful for forming a crystalline photovoltaic device 550. FIG. 5B is a schematic cross-sectional view of part of a crystalline photovoltaic device 550, having a crystalline substrate 551 and doped layer 552. At 502, a substrate is provided for constructing the photovoltaic device. The substrate will generally have a contact portion 553 disposed on a surface of the crystalline substrate 551. The contact portion 553 is conductive, and generally formed from a metal. The crystalline substrate 551 will generally be a semiconductor material such as silicon, silicon-germanium, CIGS, or a group III/V compound semiconductor. A doped silicon substrate may be monocrystalline (e.g., Si<100> or Si<111>), microcrystalline, multicrystalline, polycrystalline, strained, or amorphous.

The doped layer 552 is generally a semiconductor layer doped with a p-type or n-type dopant to create electron surplus or deficiency. The semiconductor material may be any semiconductor generally used for making crystalline solar cells, such as silicon, germanium, silicon-germanium alloy, CIGS, or group III/V compound semiconductors, and may be formed by any convenient process, such as physical or chemical vapor deposition, with or without plasma enhancement. In an n-type layer, donor type atoms are doped within the crystalline semiconductor substrate during the substrate formation process. Suitable examples of donor atoms include, but not limited to, phosphorus (P), arsenic (As), antimony (Sb). In a p-type layer, acceptor type atoms, such as boron (B) or aluminum (Al), may be doped into the crystalline silicon substrate during the substrate formation process. The substrate is typically between about 100 μm and about 400 μm thick.

At 504, a doped semiconductor layer 552 is formed on the substrate. The dopant type of the doped semiconductor layer is generally opposite that of the doped layer on the substrate. Thus, if the substrate 551 features a p-type doped layer, an n-type layer is formed, and vice versa. The p-type and n-type layers form a p-n junction region near the interface between the two layers. The semiconductor material used for the doped semiconductor layer may be the same as the semiconductor layer of the substrate, or different. In one embodiment, the doped layer of the substrate and the doped semiconductor layer formed thereon are both doped silicon layers. The doped semiconductor layer may be formed by any convenient process, such as physical or chemical vapor deposition, with or without plasma enhancement. In one embodiment, the doped semiconductor layer is formed by a plasma-enhanced chemical vapor deposition process in an apparatus similar to that described in FIG. 4B. The doped semiconductor layer will generally be less than about 50 μm thick, and in many embodiments will be about 2 μm thick or less, and may be amorphous, microcrystalline, or polycrystalline.

At 506, the doped semiconductor layer is crystallized using a thermal process similar to that described in connection with FIG. 1A above, using a treatment device that is similar to apparatus 200 discussed above. In one embodiment, a plurality of treatment zones is defined on the doped semiconductor layer, and each treatment zone is exposed to pulsed electromagnetic energy to progressively melt the treatment zone and then crystallize the melted portion. The pulses may be laser or microwave pulses, and are generally homogenized to produce uniform radiant spatial intensity across the treatment zone. The instantaneous intensity, profile and duration of each pulse is defined to move a melt front partway through the doped semiconductor layer. For example, as described above, each pulse may move the melt front between about 60 Å and about 600 Å deeper into the doped semiconductor layer. As also described above, the pulses may overlap or be separated by a rest duration.

The number of pulses delivered is selected to reach an end point, which may be the interface between the doped semiconductor layer and the underlying layer, or some proximity to that interface. After reaching the end point, the melted region is allowed to crystallize, using the underlying crystal structure, and the crystal structure of a neighboring crystallized treatment zone, as seed material. The treatment zones are processed sequentially by moving the electromagnetic energy, or the substrate, or both, so that each treatment zone is processed following its immediate neighbor.

At 508, typically patterned electrical contacts 555 are formed on the surface 556 of the treated layer 552 disposed over the substrate 551 to complete the photovoltaic cell. An anti-reflective layer 554 may also be formed over the surface 556 to reduce light reflection at the surface of the device. In this way, a crystalline photovoltaic device may be formed without relying on comparatively slow processes to deposit crystalline layers from a vapor phase.

In some embodiments, the melt end point may be defined some distance from the interface to avoid intermingling of p-type and n-type dopants. In embodiments featuring a p-type layer in close proximity, or even in contact with, an n-type layer, the melt end point may be defined about 20 Å or less from the interface between the layers. A thin unmelted layer is left between the crystalline layers as a buffer to prevent dopant intermingling. In one embodiment, the buffer layer may also be crystallized by directing sub-melt pulses through the melt phase into the buffer layer. If delivered before the melt phase begins crystallizing, a plurality of electromagnetic energy pulses may be directed toward the surface of the melt phase, and may propagate through the melt phase to the buffer layer, each pulse delivering enough energy to the buffer layer to cause incremental reorganization of the atomic structure of the buffer layer into a crystalline structure without melting the buffer layer and without causing significant dopant migration.

In one embodiment, a treatment program may be delivered to a semiconductor layer, which may be amorphous, microcrystalline, or polycrystalline, to melt and crystallize the layer without significant migration of atoms between the treated layer and an underlying crystalline layer found in the substrate. A first group of one or more pulses of electromagnetic radiation is delivered to the surface 556 of the doped semiconductor layer 552 to begin the melt process. Each pulse of the first group will have energy enough to melt a portion of the surface, and may have the same energy content as the other pulses of the first group, or may have a different energy content. The first group of pulses forms a melt phase, with a melt front at the interface between the melt phase and the solid phase.

A second group of one or more pulses is delivered to the semiconductor layer to progress the melt front through the semiconductor layer to an end point. Each pulse of the second group has energy content sufficient to propagate through the melt phase and deliver enough energy to the solid phase to melt a portion of the solid phase, thus progressing the melt front. The power delivered by the second group of pulses is generally higher than that delivered by the first group of pulses. To avoid migration of atoms between the semiconductor layer and an underlying crystalline layer, the melt end point is defined a short distance from the interface between the semiconductor layer and the underlying crystalline layer. The region between the melt end point and the interface may be a buffer layer.

After the second group of pulses is delivered, the melt front reaches the end point, and a third group of one or more pulses is delivered to the semiconductor layer to crystallize the buffer layer without melting. Each pulse of the third group has energy content enough to propagate through the melt phase and deliver energy to the buffer layer sufficient to incrementally crystallize the atoms in the buffer layer without melting and without substantial migration of atoms between the semiconductor layer and the underlying crystalline layer. After delivery of the third group of pulses, the melt phase is crystallized, the crystal structure of the melt phase developing from the crystal structure of the buffer layer and the underlying crystalline layer.

As described above, the first and second group of pulses may overlap, or may be separated by a rest duration, the degree of overlap or separation selected to allow partial refreezing of the melt phase before the next pulse of energy arrives. The third group of pulses may likewise overlap or be separated, but because the third group of pulses is designed to avoid melting, the duration, intensity, and frequency of the third group of pulses will generally be selected to allow the buffer layer to return to an ambient energy state after each pulse before the next pulse arrives. Thus, the third group of pulses may deliver a power level less than the second group of pulses, and may be less than the power level of the first group of pulses.

Figure 6:
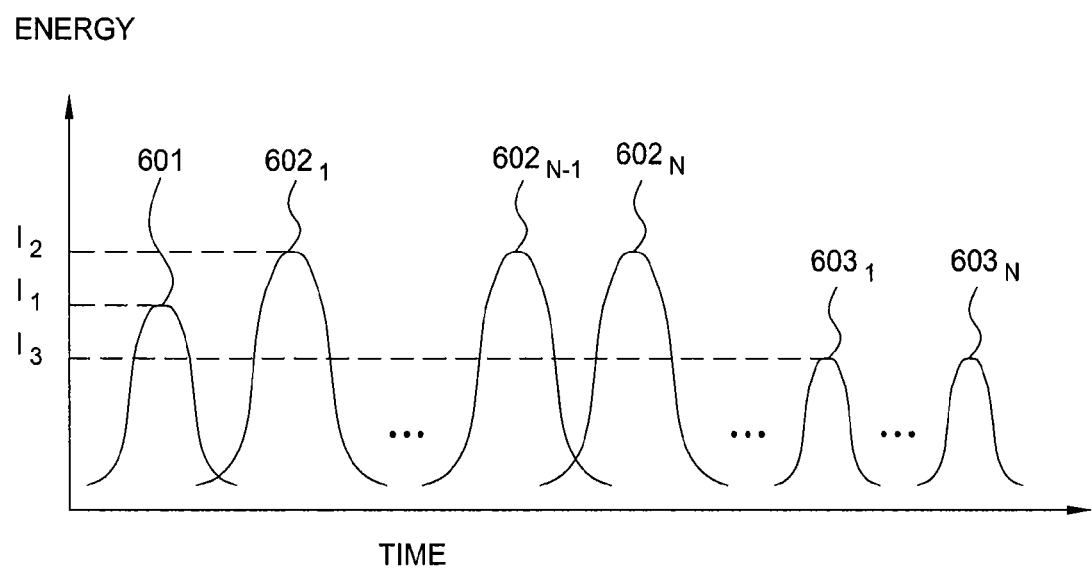
FIG. 6 schematically illustrates pulses of energy according to an embodiment described herein.

FIG. 6 schematically illustrates pulses of energy according to another embodiment. In one embodiment, multiple energy pulses having differing intensities may be useful in crystallizing a semiconductor layer formed over a crystalline layer using a melt/recrystallization process while minimizing migration of atoms between the two layers. In one example, pulses 601, 602, and 603 that have respective intensities $I_1$, $I_2$, and $I_3$ are delivered to the semiconductor layer. In one example, as shown in FIG. 6, one or more of the pulses, such as pulses $602_1$ through $602_N$ and $603_1$ through $603_N$ may comprise a group of pulses. In one embodiment, the intensity $I_1$ of the first pulse type 601 is lower than the intensity $I_2$ of the second pulse type 602. As described above, the first pulse type 601 impacts the semiconductor layer and liquefies a portion thereof. The second pulse type 602 impacts the liquid surface of the semiconductor, propagates through the liquid phase, and impacts the underlying solid phase, melting a portion of the underlying solid phase and progressing a melt front through the semiconductor layer to an end point. The third pulse type 603, has intensity $I_3$ lower than those of pulse types 601 and 602, and propagates through the liquid phase to deliver energy to the buffer layer that incrementally recrystallizes the buffer layer without melting, thus minimizing the opportunity for migration of atoms from the buffer layer to the underlying crystalline semiconductor layer. In the embodiment of FIG. 6, the N pulses of the second pulse type are shown overlapping in time. The M pulses of the third pulse type 603 may overlap in time, or may be separated by periods of ambient energy.

In one embodiment, an amorphous silicon layer of thickness 1.5 μm, in contact with an underlying crystalline layer, is crystallized using a pulsed laser treatment. The amorphous silicon layer is divided into treatment zones, and each treatment zone is subjected to a series of pulses from a 1064 nm laser, the series of pulses comprising one pulse of duration 10 ns delivering $0.35$ $J/cm^2$, followed by 10 pulses, each of 10 ns duration, each delivering $0.5$ $J/cm^2$, and each overlapping with pulses on either side by 25%, followed by 5 pulses, each of 10 ns duration, each delivering $0.3$ $J/cm^2$, and each separated by a rest duration of 10 ns. The pulsed laser treatment described above will crystallize the amorphous silicon layer while minimizing migration of atoms between the two layers.

Figure 7:
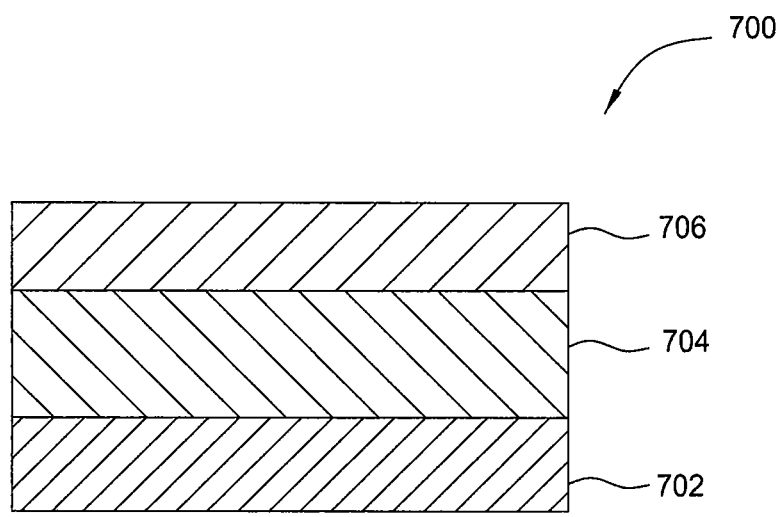
FIG. 7 is a schematic cross-sectional view of a device according to another embodiment.

In another aspect, other types of devices may benefit from a rapid crystalline semiconductor formation process such as that described herein. FIG. 7 is a schematic cross-sectional view of a device 700 according to an embodiment. The device 700 generally comprises a crystalline semiconductor layer 704, which may have a polycrystalline or monocrystalline morphology, between two functional layers 702 and 706. The functional layers 702 and 706 may each be a metal layer, for example an electrode, a dielectric layer, such as a metal oxide layer, or a semiconductor layer.

In one embodiment, the device 700 may be a memory device, wherein the functional layers 702 and 706 are metal layers and the crystalline semiconductor layer 704 is a memory cell. The memory cell may be formed in a method similar to that used to form the semiconductor layers of the photovoltaic devices described above. A semiconductor layer is formed by physical or chemical vapor deposition, and crystallized according to the melt/recrystallization processes described above in connection with FIGS. 1A, 3A, and 5A. The semiconductor layer may be doped with p-type dopants such as boron, aluminum, gallium, and indium, and n-type dopants such as phosphorus and arsenic, which may be used to form a p-n or p-i-n junction. The semiconductor material may be any elemental or compound semiconductor material suitable for memory applications, such as a group IV semiconductor, a group III/V (group 13/15) semiconductor, or a group II/VI (group 12/16) semiconductor. Some exemplary semiconductors include, but are not limited to silicon, germanium, silicon-germanium, CIGS materials, nitrides or phosphides of gallium, aluminum, and indium, sulfides, selenides, or tellurides or zinc, cadmium, and mercury, and so on. A crystalline seed layer may be deposited before forming the amorphous semiconductor layer to aid the recrystallization process. The crystalline seed layer may be formed by any process suitable for forming crystalline layers, such as a vapor phase epitaxy or chemical vapor deposition.

A plurality of discrete charge storage particles may be embedded in the crystallized layer in some embodiments. The discrete charge storage particles may improve the density of charge that can be fixed in the memory cell. The discrete charge storage particles, which may be metal atoms or atom clusters, may be deposited by any suitable deposition process, such as PVD or CVD, between two crystalline layers, or may be implanted by ion beam or plasma immersion ion implantation. In a deposition process, a first semiconductor layer is formed on a substrate, the discrete charge storage particles are deposited on the first semiconductor layer, and a second semiconductor layer is formed on the discrete charge storage particle layer. The first and second semiconductor layers may each be, individually, amorphous, microcrystalline, or polycrystalline. The entire structure is then recrystallized by a pulsed energy melt process, as described above.

In another embodiment the device 700 may be a photonic device, such as a light-emitting diode (LED). In an LED embodiment, the functional layer 702 is generally a dielectric substrate, such as sapphire, that provides structural support for the active portions of the device. The functional layer 702 may also include a buffer layer or transition layer formed on the surface of the functional layer 702 to facilitate compatibility between the functional layer 702 and the crystalline semiconductor layer 704 to be formed thereon. The crystalline semiconductor layer 704 is generally a group III nitride semiconductor such as gallium nitride, aluminum nitride, indium nitride, or mixtures thereof. The surface of the functional layer 702 may thus be treated to form a thin layer of aluminum nitride or a mixture of nitrides of aluminum, gallium, and indium, as a buffer layer or transition layer.

The crystalline semiconductor layer 704 in the LED embodiment is generally a group III nitride layer, and may comprise gallium nitride, aluminum nitride, and indium nitride. The crystalline semiconductor layer 704 comprises a multi-quantum well material, such as indium gallium nitride, as an active component. The crystalline semiconductor layer 704 also generally comprises an undoped nitride layer, such as gallium nitride, and an n-type doped nitride layer, which may also be gallium nitride doped with an n-type dopant such as those described above.

The functional layer 706 in the LED embodiment is generally a p-type doped group III nitride layer, such as a gallium nitride or aluminum gallium nitride layer doped with a p-type dopant.

The layers in the LED device are generally formed by a chemical vapor deposition process, and/or hydride vapor phase epitaxy (HVPE) process, in which a group III metal such as gallium, indium, or aluminum, is exposed to a halogen source such as hydrogen chloride to form a group III metal halide, which in turn is mixed with a nitrogen source such as ammonia to form the group III nitride material, as is known in the art. The layers deposited by such a process may be crystallized into a polycrystalline or monocrystalline morphology using the pulsed energy melt crystallization process described above in connection with FIGS. 1A, 3A, and 5A.

It should be noted that in all instances of forming a multi-layer semiconductor device, all semiconductor layers in the device may be crystallized using the pulsed energy melt crystallization processes described herein, or only selected layers may be crystallized. In one embodiment, all semiconductor layers in the device may be formed having amorphous, microcrystalline, or polycrystalline morphology, and then all layers are recrystallized using a single progressive pulsed energy melt/recrystallization process. In another embodiment, individual layers selected to be crystallized may be subjected to a pulsed energy melt/recrystallization process before forming a subsequent layer. It is believed that the process of crystallizing, or recrystallizing, one layer at a time can be effectively used to individually process each layer without significantly affecting the crystalline structure or composition of adjacent layers, due to the controlled delivery and short duration of the energy delivered during the pulsed energy melt crystallization process. Using such methods, devices having high-efficiency crystalline semiconductor components with polycrystalline or monocrystalline morphology may be manufactured in a cost-efficient, high-throughput process.

While the foregoing is directed to embodiments of the invention, other and further embodiments of the invention may be devised without departing from the basic scope thereof.

What is claimed is:

1. A method of treating a substrate, comprising:
identifying a first treatment zone;
forming a molten area of the first treatment zone by exposing a surface of the first treatment zone to a first laser pulse and a second laser pulse, wherein the first laser pulse and the second laser pulse have the same duration and intensity;
recrystallizing the molten area of the first treatment zone while exposing the first treatment zone to a plurality of laser pulses, wherein each pulse of the plurality of laser pulses melts a portion of a recrystallized area;
identifying a second treatment zone adjacent to the first treatment zone; and
repeating the forming a molten area and the recrystallizing the molten area with the second treatment zone.

2. The method of claim 1, wherein a duration between the first laser pulse and the second laser pulse is less than a time necessary for a portion of the molten area to refreeze.

3. The method of claim 1, wherein each pulse of the plurality of laser pulses has the same duration and intensity as the first laser pulse.

4. A method of treating a substrate, comprising:
identifying a first treatment zone;
forming a molten area of the first treatment zone by exposing a surface of the first treatment zone to a first laser pulse;
recrystallizing the molten area of the first treatment zone while exposing the first treatment zone to a plurality of laser pulses, wherein each pulse of the plurality of laser pulses melts a portion of a recrystallized area, wherein each pulse of the plurality of laser pulses has a duration or an intensity that is different from the first laser pulse;
identifying a second treatment zone adjacent to the first treatment zone; and
repeating the forming a molten area and the recrystallizing the molten area with the second treatment zone.

5. The method of claim 4, wherein the second treatment zone and the first treatment zone share a boundary.

6. The method of claim 4, wherein the forming a molten area of each treatment zone further comprises exposing the surface of each treatment zone to a second laser pulse.

7. A method of treating a substrate, comprising:
identifying a treatment zone of the substrate;
delivering a first plurality of laser pulses to the treatment zone, wherein each pulse of the first plurality of laser pulses melts a portion of the treatment zone, and a duration between each pulse of the first plurality of laser pulses is less than a time to freeze the portion of the treatment zone that melted; and
delivering a second plurality of laser pulses to the treatment zone of the substrate, wherein each pulse of the second plurality of laser pulses melts a portion of the treatment zone, and a duration between each pulse of the second plurality of laser pulses is more than a time to freeze the portion of the treatment zone that melted.

8. The method of claim 7, wherein each pulse of the first plurality of laser pulses overlaps with adjacent pulses.

9. The method of claim 7, wherein a duration between each pulse of the first plurality of laser pulses and adjacent pulses of the first plurality of laser pulses is the same, and wherein a duration between each pulse of the second plurality of laser pulses and adjacent pulses of the second plurality of laser pulses is the same.

10. The method of claim 7, wherein an intensity of each pulse of the first plurality of laser pulses and of each pulse of the second plurality of laser pulses is the same.

* * * * *